United States Patent
Murray et al.

(10) Patent No.: US 6,172,553 B1
(45) Date of Patent: *Jan. 9, 2001

(54) HIGH VOLTAGE STEERING NETWORK FOR EEPROM/FLASH MEMORY

(75) Inventors: Kenelm Murray, Sunnyvale; Donato Montanari, Mountain View, both of CA (US)

(73) Assignee: Cypress Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/104,643

(22) Filed: Jun. 25, 1998

(51) Int. Cl.[7] ........................................ G05F 1/10
(52) U.S. Cl. ................................. 327/530; 365/226
(58) Field of Search .................................. 327/530, 534, 327/536, 537; 363/59, 60; 365/226

(56) References Cited

U.S. PATENT DOCUMENTS

| | | | |
|---|---|---|---|
| 4,897,774 | 1/1990 | Bingham et al. | 363/61 |
| 4,935,644 | 6/1990 | Tsujimoto | 307/296.2 |
| 5,059,815 | 10/1991 | Bill et al. | 307/246 |
| 5,276,646 | 1/1994 | Kim et al. | 365/189.09 |
| 5,311,480 | 5/1994 | Schreck | 365/230.06 |
| 5,319,604 | 6/1994 | Imondi et al. | 365/230.06 |
| 5,371,705 | * 12/1994 | Nakayama et al. | 365/189.9 |
| 5,438,542 | * 8/1995 | Atsumi et al. | 365/182 |
| 5,461,557 | 10/1995 | Tamagawa | 363/60 |
| 5,592,430 | * 1/1997 | Ohtsuki | 327/536 |
| 5,701,272 | 12/1997 | Brennan, Jr. | 365/230.06 |
| 5,757,228 | 5/1998 | Furutani et al. | 327/589 |
| 5,767,735 | 6/1998 | Javanifard et al. | 327/536 |
| 5,796,656 | 8/1998 | Kowshik et al. | 365/185.23 |
| 5,812,459 | 9/1998 | Atsumi et al. | 365/185.23 |
| 5,841,696 | 11/1998 | Chen et al. | 365/185.11 |
| 5,889,664 | 3/1999 | Oh | 363/60 |

OTHER PUBLICATIONS

IEEE JSSC, vol. 27, No. 11, Nov. 1992, A 5V–only Operation 0.6–$\mu$m Flash EEPROM with Row Decoder Scheme in Triple–Well Structure, A. Umezawa, et al.

"Non–Volatile Semiconductor Memories, Technologies, Design and Applications", IEEE Press, Ed Chenming Hu, 1991, JSCCC Dig. Tech.

IEEE JSSC, vol. 24, No. 5, Oct. 1989, "Analysis and Modeling of On–Chip High–Voltage Generator Circuits for Use in EEPROM Circuit", Witters, et al.

IEEE JSSC, vol. 32, No. 6, Jun. 1997, "Efficiency Improvement in Charge Pump Circuits", Wang et al.

IEEE JSSC, vol. 33, No. 1, Jan., 1998, "Internal Voltage Generator for Low Voltage Quarter–Micrometer Flash Memories", T. Kawahara, et al.

IEEE JSSC, vol. 32, No. 8, Aug. 1997, "Circuit Techniques for 1.5V Power Supply Flash Memory", N. Otsuka and M. Horowitz.

(List continued on next page.)

* cited by examiner

Primary Examiner—Jung Ho Kim
(74) Attorney, Agent, or Firm—Christopher P. Maiorana, P.C.

(57) ABSTRACT

A circuit comprising a positive switch and a steering network. The positive switch may be configured to present a first and a second switch signal in response to a first select signal. The steering network may be configured to present a high voltage output that may transition between a very high positive and a very low negative voltage, where the transition may respond to a high positive voltage input, a low negative voltage input, a first and second switch signal, and a second select signal.

16 Claims, 5 Drawing Sheets

OTHER PUBLICATIONS

IEEE JSSC, vol. 31, No. 11, Nov. 1996, "Bit–Line Clamped Sensing Multiplex and Accurate High Voltage Generator for Quarter–Micron Flash Memories", T. Kawahara, et al.

IEEE JSSC, vol. 27, No. 11, Nov. 1992, A 5V–only 16Mb Flash Memory with Sector Erase Mode, T. Jinbo et al.

IEEE JSSC, vol. 32, No. 1, Jan. 1997, "Program Load Adaptive Voltage Generator for Flash Memories", Fiocchi, et al.

IEEE JSSC, vol. SC–18, No. 5, Oct. 1983, "Control Logic and Cell Design for a 4K NVRAM", Lee, et al.

IEEE JSSC, vol. SC–18, No. 5, Oct. 1983, "High–Voltage Regulation and Process Considerations for High–Density 5V–only $E^2$PROM's", Oto, et al.

IEEE JSSC, vol. SC–11, No. 4, Jun. 1976, "On–Chip High–Voltage Generation in NMOS Integrated Circuits Using an Improved Voltage Multiplier Technique", John F. Dickson.-

HIGH VOLTAGE STEERING NETWORK FOR EEPROM/FLASH MEMORY

FIELD OF THE INVENTION

The present invention relates to high voltage steering networks generally and, more particularly, to a high voltage steering network for use in a EEPROM/FLASH memory.

BACKGROUND OF THE INVENTION

Non-volatile memories such as EEPROM and FLASH memories generally require a variety of voltages that may be above the positive supply voltage or below the negative supply voltage. To generate the programming voltages, pump circuits may be used in a circuit where both high positive voltages and high negative voltages are required, conventional approaches often implement separate charge pumps to generate each of the separate voltages. Once generated, said separate voltages are transferred independently from each other to the different blocks of the circuit. This implies that the receiving blocks must handle both a high positive voltage signal and a high negative voltage on separate inputs. In order to do so, each receiving block may need additional local circuitry implemented on the die. Where a number of different blocks require the high positive voltage and the high negative voltage, as is the case in EEPROM/FLASH memories, additional circuitry, such as local charge pumps, may have to be duplicated on each wordline as was implemented in U.S. Pat. No. 5,311,480. The more places the high positive voltage and the low negative voltage are required, the more circuit area may be required. Were it feasible to combine said separate high positive voltage and separate high negative voltage into a single input, then the receiving blocks would only need to handle high voltage from a simple input instead of from two inputs which would significantly reduce the die area. This invention proposes a method and a circuit to combine said separate high positive voltage and separate high negative voltage onto a single output.

SUMMARY OF THE INVENTION

The present invention concerns a circuit comprising a high voltage positive switch and a steering network. The high voltage positive switch may be configured to present first and second switch signals in response to a first select signal. The steering network may be configured to present a high voltage output that may transition between a very high positive and a very low negative voltage, where the transition may respond to a high voltage positive input, a low voltage negative input, a first and second switch signal, and a second select signal.

The objects, features and advantages of the present invention include providing a circuit capable of alternately steering a very high positive voltage (e.g., VPP) or a very low negative voltage (e.g., VNN) to a single output using a very small, area-efficient steering network.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
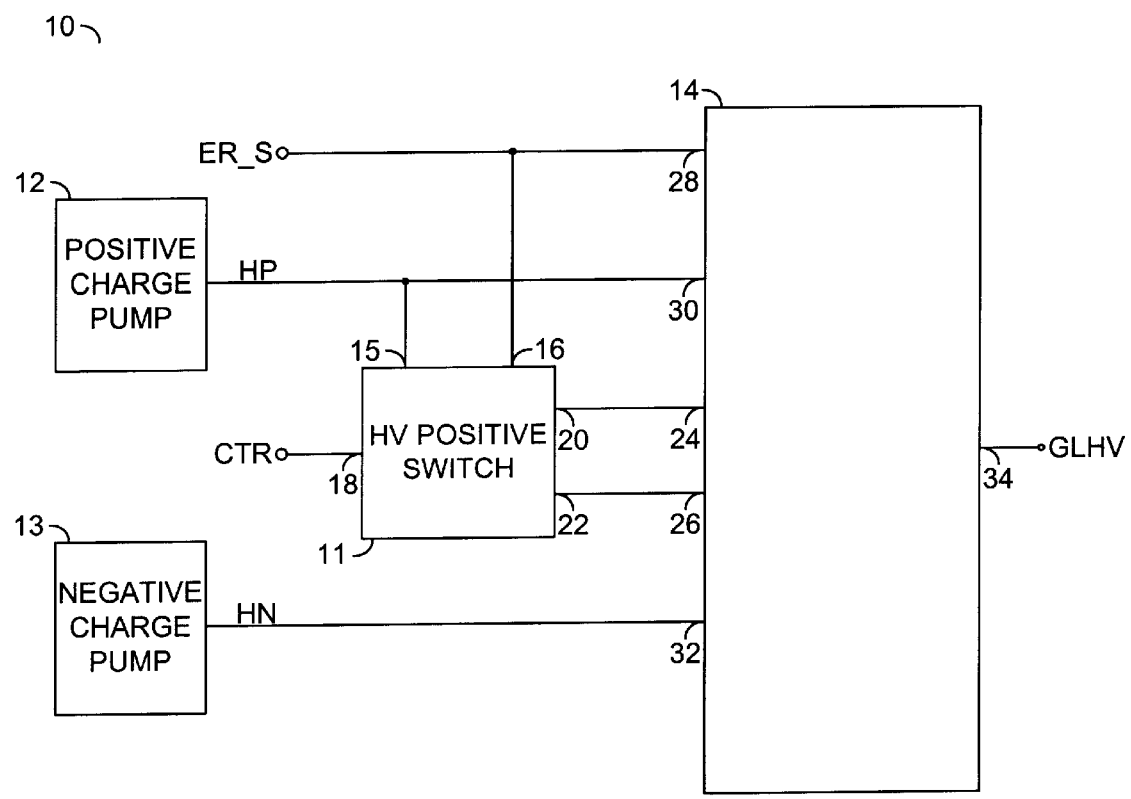
FIG. 1 is a block diagram of a preferred embodiment of the present invention.

Referring to FIG. 1, a block diagram of a circuit 10 illustrating a preferred embodiment of the present invention is shown. The circuit 10 generally comprises a high voltage (HV) positive switch 11, a positive charge pump 12, a negative charge pump 13, and a steering network block (or circuit) 14. The HV positive switch 11 may have an input 15 that may receive a signal (e.g., HP), an input 16 that may receive a signal (e.g., ER_S), and an input 18 that may receive a control signal (e.g., CTR). The HV positive switch 11 may have an output 20 and an output 22 that may present signals to an input 24 and an input 26 respectively of the steering network 14. The HV positive switch 11 will be described in more detail in connection with FIG. 3.

The steering network 14 has an input 28 that may receive the signal ER_S, an input 30 that may receive the high voltage positive signal (e.g., HP) from the positive charge pump 12, and an input 32 that may receive a high voltage negative signal (e.g., HN) from the negative charge pump 13 and inputs 24 and 26 that may receive control signals 20 and 22 respectively from the HV positive switch. The steering network 14 may have an output 34 that may present an output signal (e.g., GLHV).

Figure 2:
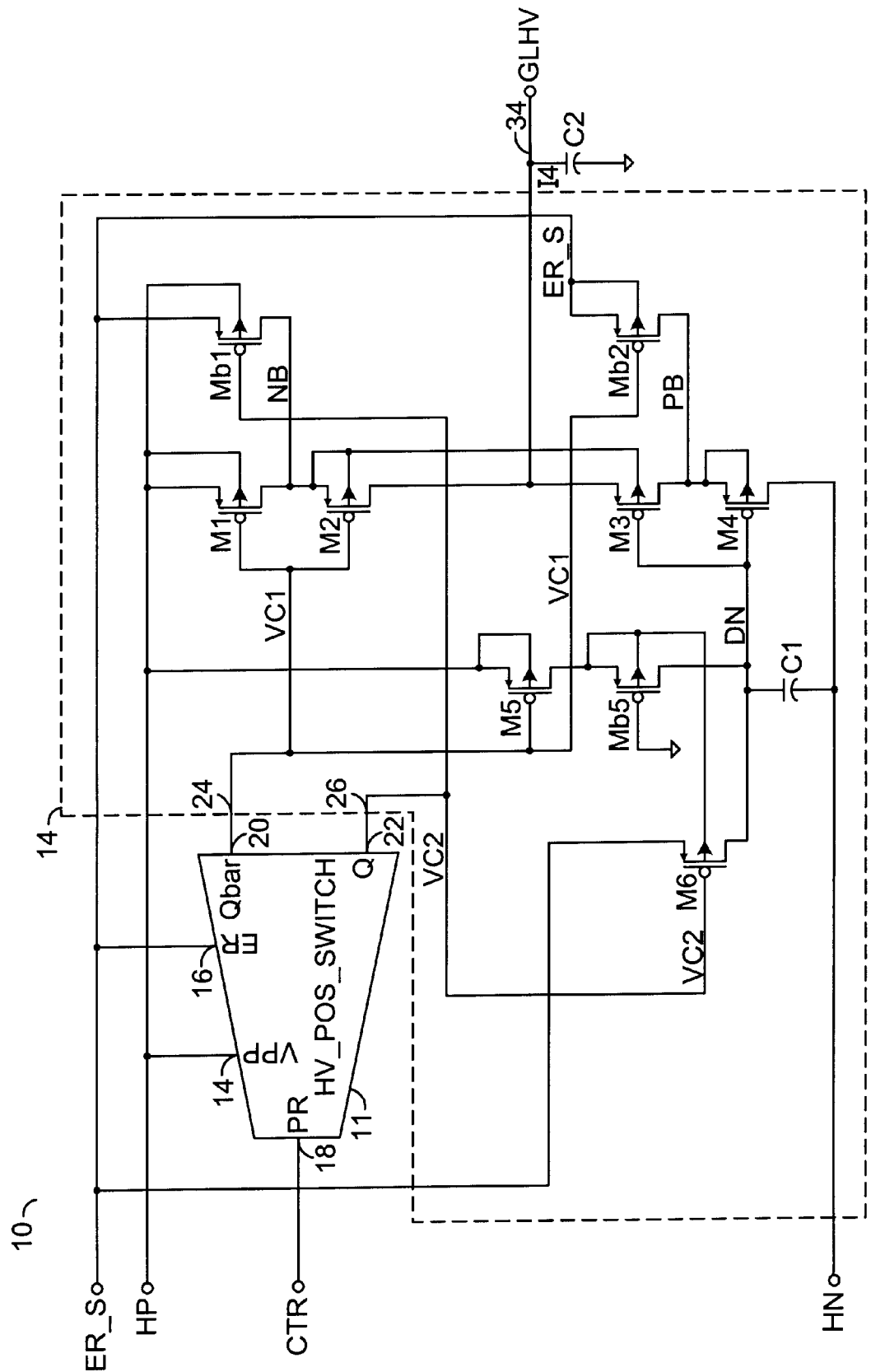
FIG. 2 is a circuit diagram of a preferred embodiment of the present invention.

Referring to FIG. 2, a more detailed diagram of the circuit 14 is shown. The steering network 14 is shown comprising a transistor M1, a transistor M2, a transistor M3, a transistor M4, a transistor M5, a transistor M6, a transistor Mb5, a transistor Mb2, a transistor Mb1, and a capacitor C1. The capacitor C2 may represent the external load capacitance at the output 34.

A high positive output may occur on the signal GLHV when the control signal CTR is at Vcc, the signal ER_S is at an intermediate high voltage between Vcc and Vpp (for example 5V) and the positive charge pump 12 delivers a high voltage Vpp at the node HP. A node Vc1 (i.e., input 24) may then be at Vss and a node Vc2 (i.e., input 26) may be raised to Vpp by the HV positive switch 11 in response to control signal CTR being at Vcc. Hence, the transistors M1 and M2 are on, which may pass a high voltage Vpp to output signal GLHV. Under such conditions, the transistors M5 and MSb may both be on and a node DN (i.e., a node connecting the sources of the transistors Mb5 and M6 with the gates of the transistors M3 and M4) may be at Vpp, which generally turns off the transistors M3 and M4. The transistor M6, may also be off, since the gate (which is connected to the node Vc2) is at Vpp.

In terms of junction-breakdown issues, the transistors M3 and M4 may be the most vulnerable since they may be connected to the signal GLHV (which may be as high as Vpp) at one terminal (e.g., the drain), and the high voltage negative signal HN at the other terminal (e.g., the source). The voltage level of the high voltage negative signal HN may depend on how the negative charge pump 13 is implemented and how the negative charge pump 13 operates in conjunction with the positive charge pump 12. In one example, the high voltage negative signal HN may be at −5V while the high voltage positive signal HP may be at 15.5V. With such an implementation, the overall voltage difference across the transistors M3 and M4 may be 20.5V which, if uncompensated, may lead to junction breakdown conditions. To overcome junction breakdowns, the transistor Mb2 may be positioned between a node Vc1 (i.e., a node connected to the input 24) and the input 28 (i.e., the signal ER_S). Since the node Vc1 is generally at Vss under these conditions (i.e., signal CTR at Vcc), the transistor Mb2 may be on which forces a node PB (i.e., a node between the terminals of the transistors M3 and M4 and the source of the transistor Mb2) to a voltage level of 5V (e.g., the voltage of the signal ER_S). This may split the 20.5V difference across the junctions of the transistors M3 and M4 and may avoid breakdown.

A high negative voltage at the output node GLHV may occur when the control signal CTR and the signal ER_S are set at Vss before the negative pump 13 moves the node HN from Vss down to Vnn. In one example, when the node HN transitions from Vss to Vnn, the node HP may transition to roughly 8V (which may vary according to the technology process and supply voltages implemented), which may move the node Vc1 to roughly 8V as well. This generally turns the transistors M1, M2, Mb2 and M5 off. Now the node Vc2 may be at Vss which is not generally low enough to turn the transistor M6 on, since the signal ER S is at Vss. However, the transistor M6 may prevent the node DN from going too positive when the transistor M5 is switched off. More specifically, as the transistor MS is turned off by the control signal CTR, the node DN is no longer anchored to the node HP and can float. The transistor M6 may allow the node DN to float in the negative direction, but not at a voltage level higher than Vss plus a threshold voltage. Therefore, as the node HN begins to ramp down to Vnn, the node DN follows the node HN due to the coupling of the capacitance C1. The ramping of the node HN turns on transistors M3 and M4 that may transfer the negative voltage to the signal GLHV.

Symmetrically to the previous case, the junctions of the transistors M1 and M2 may be exposed to a very high voltage difference (e.g., HP- (-HN), or 18V). Thus, the transistor Mb1 may be used to force the node NB (i.e., a node between the source of the transistor M1, the drain of the transistor M2 and the source of the transistor Mb1) to a voltage level close to Vss. This generally ensures that the voltage across M1 and M2 is not higher than 11V. An additional potential breakdown condition may occur when the node DN reaches Vnn (e.g., -10V) and the node HP is at 8V. In the absence of the transistor Mb5, this may have led to 18V across transistor MS.

The arrangements introduced in the circuit 10 are generally designed to prevent junction-breakdown problems in a circuit implemented in a technology where the breakdown voltage for high voltage transistors is limited (e.g., 12V). In different technologies or in applications where the output voltage is not so extreme, the transistors Mb1, Mb2, Mb5, M3 and M2 may be removed, making the circuit 10 much simpler and easy to layout. For example, all of the PMOS devices may be located within the same n-well.

Figure 3:
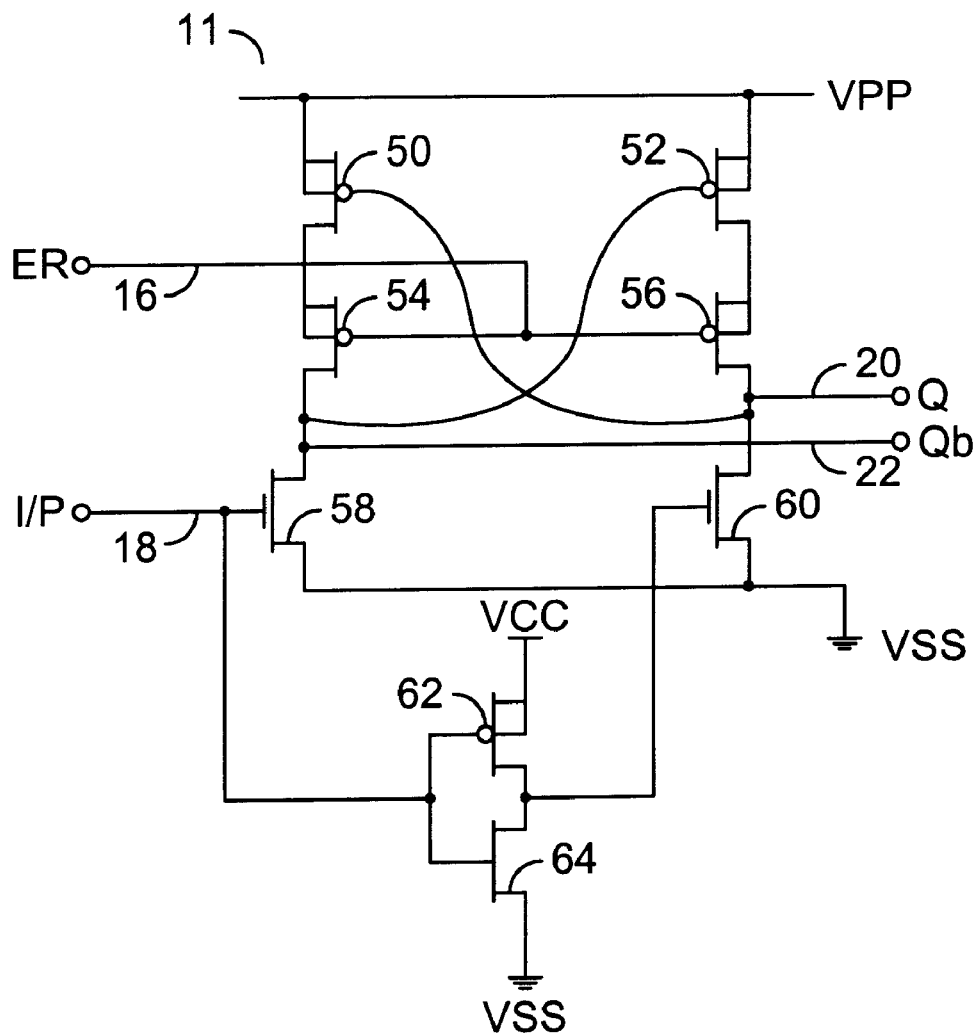
FIG. 3 is a more detailed diagram of the HV positive switch of FIG. 2.

Referring to FIG. 3, a more detailed diagram of the HV positive switch 11 is shown generally comprising a transistor 50, a transistor 52, a transistor 54, a transistor 56, a transistor 58, a transistor 60, a transistor 62, and a transistor 64. The output 20 and the output 22 are generally complementary signals. In general, as the signal at the input 18 transitions between a zero and Vcc, the signal at the output 20 transitions between zero and Vpp. A signal ER may typically stay at a zero volts and may be taken to an intermediate high voltage when Vpp is at a very high voltage (e.g., 15V) or when junction breakdown may occur in the P transistors (e.g., the transistors 50 and 52).

Figure 4:
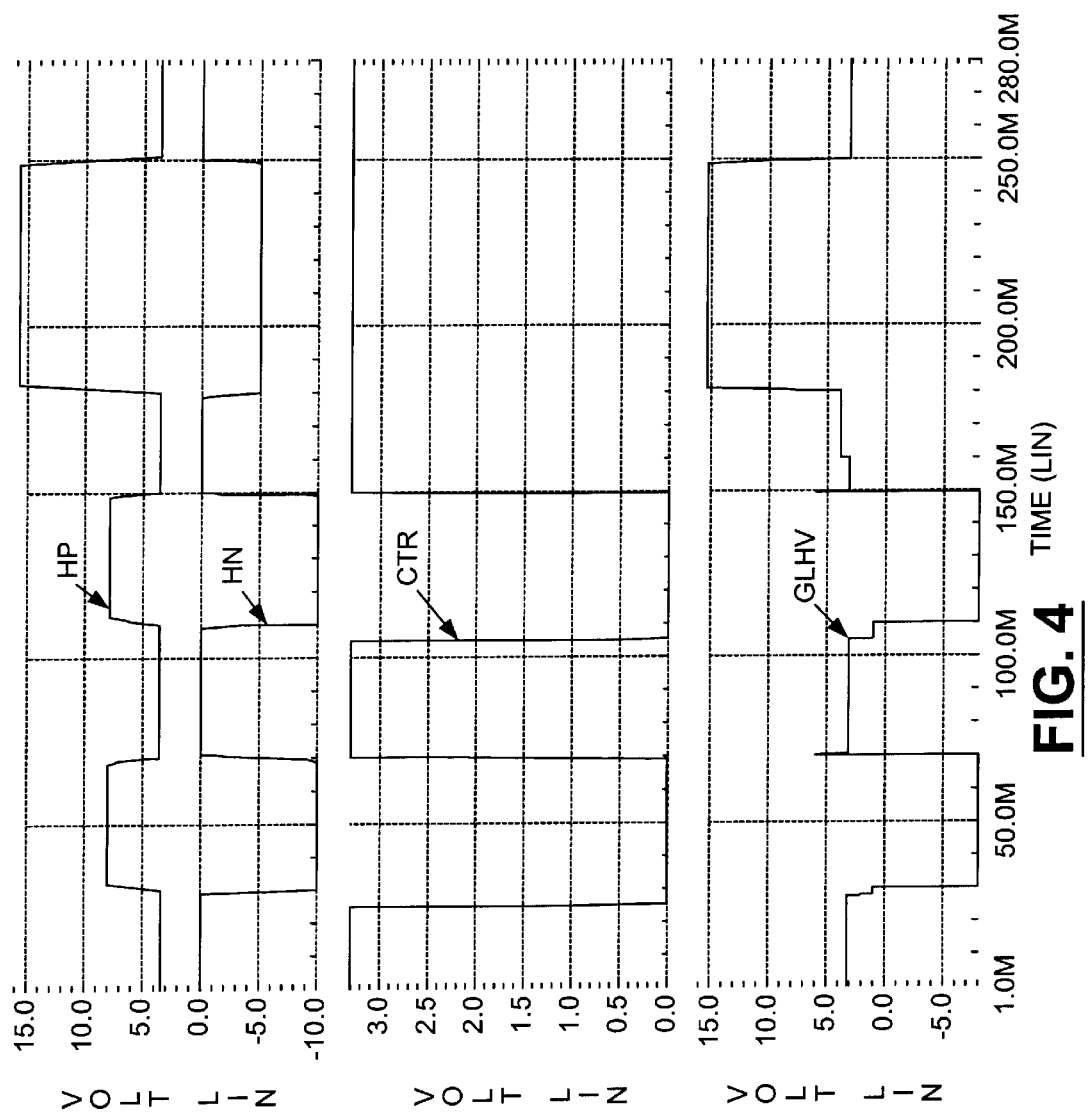
FIG. 4 is a timing diagram of the circuit of FIG. 1.

Referring to FIG. 4, a transient simulation is shown where the signal CTR is taken low twice in a row. As a result, the signal GLHV follows to a negative voltage of -7.7V for a Vnn of -10V. A voltage drop of 2.3V from the node HN to the signal GLHV is observed mainly due to the fact that the node DN does not generally transition more negative than the node HN plus a PMOS threshold voltage (i.e., -9.4V). Thus, the transistor M4 cannot pass the node HN fully with -9.4V at its gate, which results in the node PB being at -8.8V. An additional 1V may be dropped through the transistor M3. When CTR goes high, the signal GLHV follows the node HP up to Vpp.

Figure 5:
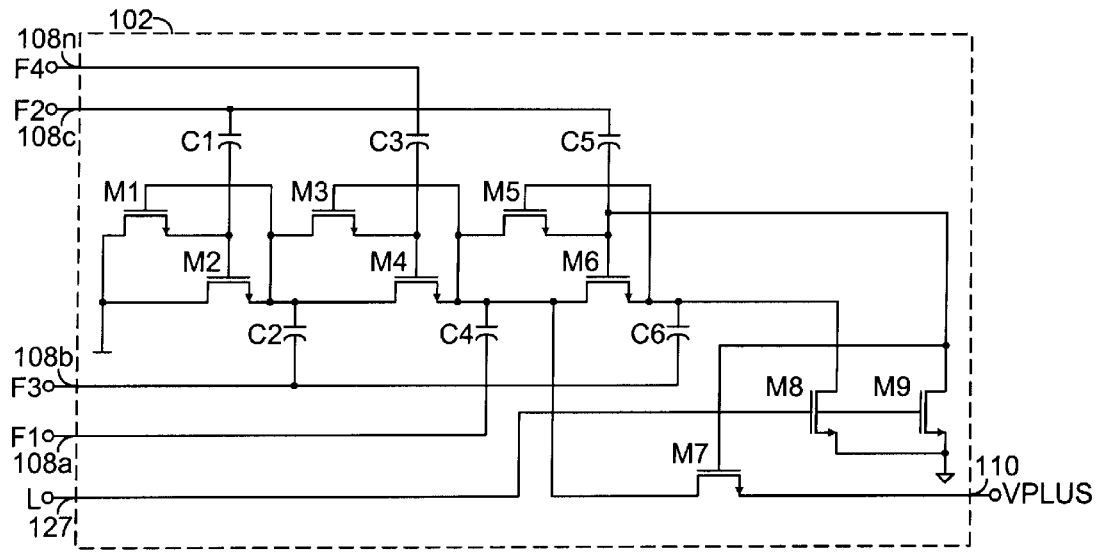
FIG. 5 is a circuit diagram of a four-phase positive pump.

Referring to FIG. 5, a circuit diagram of one example of a four-phase positive pump 102 is shown. The pump 102 comprises a capacitor C1, capacitor C2, capacitor C3, capacitor C4, capacitor C5, capacitor C6, a transistor M1, a transistor M2, a transistor M3, a transistor M4, a transistor M5, a transistor M6, a transistor M7, a transistor M8, and a transistor M9. The transistor M1 has a source that may be coupled to ground. The gate of the transistor M1 is generally coupled to the drain of the transistor M2, the source of the transistor M3 and a first side of the capacitor C2. A second side of the capacitor C2 is generally coupled to the input 108b. The drain of the transistor M1 is generally coupled to the gate of the transistor M2 as well as to a first side of the capacitor C1. A second side of the capacitor C1 is generally coupled to the input 108c. The input 108c is also coupled to a first side of the capacitor C5. The input 108n is generally coupled to a first side of the capacitor C3. The input 108b is generally coupled to a second side of the capacitor C2 and the capacitor C6. The transistors M3, M4, M5 and M6 are generally configured in a similar fashion to the transistors M1 and M2. The transistors M7, M8 and M9 generally provide output isolation.

Figure 6:
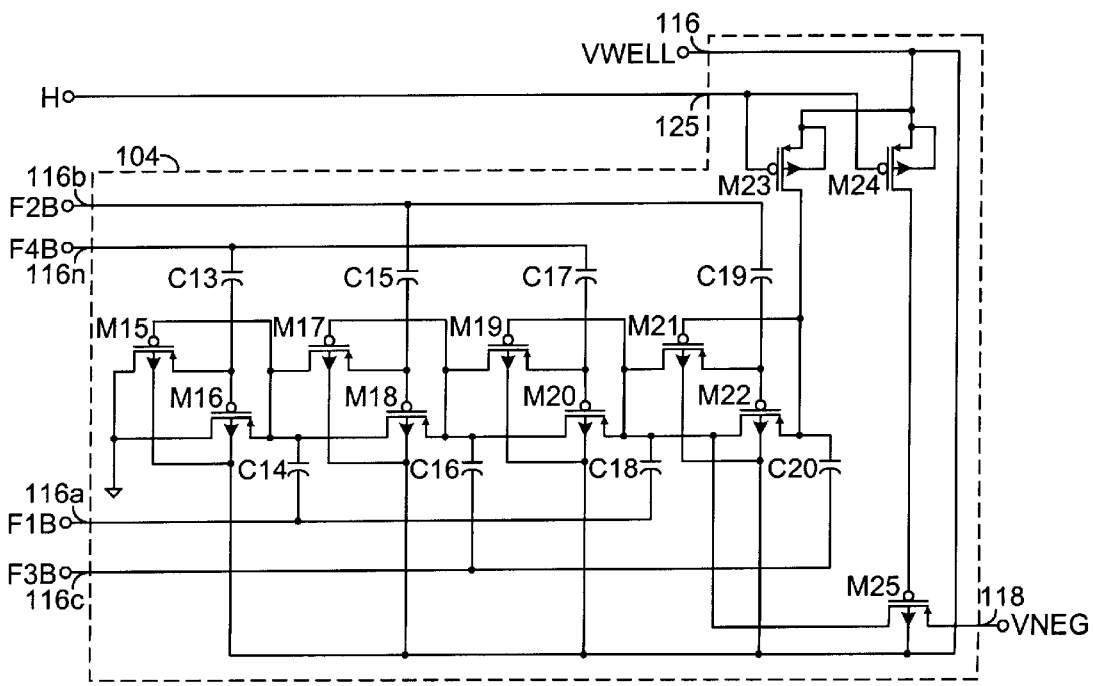
FIG. 6 is a circuit diagram of a four-phase negative pump.

Referring to FIG. 6, a more detailed diagram of an example of a four-phase negative pump 104 is shown. The pump 104 generally comprises a capacitor C13, a capacitor C14, a capacitor C15, a capacitor C16, a capacitor C17, a capacitor C18, a capacitor C19, and a capacitor C20, a transistor M15, a transistor M16, a transistor M17, a transistor M18, a transistor M19, a transistor M20, a transistor M21, a transistor M22, a transistor M23, and a transistor M24. The transistors M14–M22 are coupled in a similar fashion as the transistors M1–M16 shown in FIG. 3. However, the transistors M15–M22 are generally P-channel transistors. Additionally, the sources of the transistors M15 and M16 are generally coupled to ground. The positive pump 102 and the negative pump 1904 are merely examples of pumps that may be used with the present invention. Other pumps may be implemented to meet particular design criteria.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
    a steering network configured to dynamically generate a high voltage output in response to (i) a high positive voltage input, and (ii) a low negative voltage input, wherein said high voltage output comprises either a high positive voltage level or a low negative voltage level, said steering network comprises a first breakdown transistor coupled to one of one or more first control signals through two of a plurality of transistors having respective sources and drains cascaded together between said low negative voltage input and said high positive voltage input.

2. The circuit according to claim 1, wherein said high positive voltage level is less positive than said high positive voltage input and said low negative voltage level is less negative than said low negative voltage input.

3. The circuit according to claim 1, further comprising:

a high voltage positive charge pump configured to generate said high positive voltage input; and a high voltage negative charge pump configured to generate said low negative voltage input.

4. The circuit according to claim 1, wherein said steering network is further configured in response to said one or more first control signals.

5. The circuit according to claim 4, further comprising a switch configured to generate said one or more first control signals in response to a second signal.

6. The circuit according to claim 5, wherein said switch is further configured to receive said high positive voltage input.

7. The circuit according to claim 5, wherein said switch comprises a high voltage positive switch and said second signal comprises a switch control signal.

8. The circuit according to claim 1, wherein said steering network further comprises a second breakdown transistor coupled to another one of said one or more first control signals through another of said plurality of transistors.

9. A method for programming a memory, comprising the steps of:

(A) initiating an operation in said memory;

(B) generating a programming voltage comprising a high positive voltage or a low negative voltage in response to step (A), wherein said programming voltage is generated using a first breakdown transistor coupled to one of one or more first control signals through two of a plurality of transistors having respective sources and drains cascaded together between a low negative voltage input and a high positive voltage input; and (C) providing said programming voltage to a wordline of said memory.

10. The method according to claim 9, wherein said programming voltage is presented to a plurality of wordlines of said memory.

11. The method according to claim 31, wherein said high positive voltage level is less positive than said high positive voltage input and said low negative voltage level is less negative than said low negative voltage input.

12. The method according to claim 9, further comprising steps:

(C) generating said high positive voltage input using a high voltage positive charge pump; and (D) generating said low negative voltage input using a high voltage negative charge pump.

13. A circuit comprising:

a first charge pump configured to generate a high positive voltage input;

a second charge pump configured to generate a low negative voltage input;

a switch configured to generate first and second control signals in response to a second signal; and a steering network configured to present a high voltage output in response to (i) said high positive voltage input, (ii) said low negative voltage input, and (iii) said first and second control signals, wherein said high voltage output comprises either a high positive voltage level or a low negative voltage level, said steering network comprises a first breakdown transistor coupled to one of said one or more first control signals through two of a plurality of transistors having respective sources and drains cascaded together between said low negative voltage input and said high Positive voltage input.

14. The circuit according to claim 13, wherein said high positive voltage level is less positive than said high positive voltage input and said low negative voltage level is less negative than said low negative voltage input.

15. The method according to claim 9, wherein said step (B) further comprises:

(B-2) generating said programming voltage using a second breakdown transistor coupled to another one of said one or more first control signals through another of said plurality of transistors.

16. The circuit according to claim 13, wherein said steering network further comprises a second breakdown transistor coupled to another one of said one or more first control signals through another of said plurality of transistors.

* * * * *